United States Patent
Zanchi et al.

(10) Patent No.: US 9,444,480 B1
(45) Date of Patent: Sep. 13, 2016

(54) RADIATION-HARDENED INTERLEAVED ANALOG-TO-DIGITAL CONVERTER CIRCUITS AND METHODS OF CALIBRATING THE SAME

(71) Applicant: THE BOEING COMPANY, Chicago, IL (US)

(72) Inventors: Alfio Zanchi, Huntington Beach, CA (US); Mehdi Katoozi, Issaquah, WA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 15/053,238

(22) Filed: Feb. 25, 2016

(51) Int. Cl.
   *H03M 1/10* (2006.01)
   *H03M 1/34* (2006.01)
(52) U.S. Cl.
   CPC .............. *H03M 1/1009* (2013.01); *H03M 1/34* (2013.01)
(58) Field of Classification Search
   CPC ....................... H03M 7/00; H03M 2201/1109
   USPC ....... 341/155, 120, 141, 122, 118, 161, 110, 341/139
   See application file for complete search history.

(56) References Cited

U.S. PATENT DOCUMENTS

| | | | | |
|---|---|---|---|---|
| 3,887,912 A | * | 6/1975 | Kuwamura | H03M 1/42 341/161 |
| 5,796,358 A | * | 8/1998 | Shih | H03M 1/183 341/139 |
| 5,808,573 A | * | 9/1998 | Shih | G11B 20/10055 341/110 |
| 7,148,828 B2 | * | 12/2006 | Fernandez | H03M 1/10 341/120 |
| 8,860,589 B1 | * | 10/2014 | Shivaram | H03M 1/0617 341/118 |
| 2013/0201043 A1 | * | 8/2013 | Wong | H03M 1/125 341/122 |
| 2014/0025703 A1 | * | 1/2014 | Samuels | G06F 17/30424 707/769 |
| 2014/0292551 A1 | * | 10/2014 | Kull | H03M 1/121 341/141 |

OTHER PUBLICATIONS

Brandolini, M. et al., A 5GS/s 150mW 10b SHA-Less Pipelined/SAR Hybrid ADC in 28nm CMOS, 2015 IEEE International Solid-State Circuits Conference, ISSCC 2015, Session 26, Nyquist-Rate Converters, 26.6, pp. 468-470.

Li, J. et al., A Digital Timing Mismatch Calibration Technique in Time-Interleaved ADCs, IEEE Transactions on Circuits and Systems-II: Express Briefs, Jul. 2014, pp. 486-490, vol. 61, No. 7.

(Continued)

*Primary Examiner* — Jean B Jeanglaude
(74) *Attorney, Agent, or Firm* — Armstrong Teasdale LLP

(57) ABSTRACT

An analog-to-digital converter (ADC) includes at least first thru third ADC slices configured to sample input signal and transmit first thru third digitally converted values thereof, at least one reference ADC slice configured to sample input signal and transmit a digitally converted reference value, first thru third and reference registers coupled to first thru third and reference ADC slices, respectively, a delay register having an input and output, and configured to produce a sample time adjustment signal, where the sample time adjustment signal facilitates adjustment of a phase of a next time sampling of the input signal by the second ADC slice, and a plurality of computational circuit elements coupled to the input, output, and the registers, and configured to determine values of an error, an approximate time derivative of the input signal estimated from the third, second and first sampled time point, and the sample time adjustment signal.

26 Claims, 6 Drawing Sheets

(56) References Cited

OTHER PUBLICATIONS

Stepanovic, D. et al., A 2.8 GS/s 44.6 mW Time-Interleaved ADC Achieving 50.9 dB SNDR and 3 dB Effective Resolution Bandwidth of 1.5 GHz in 65 nm CMOS, IEEE Journal of Solid-State Circuits, Apr. 2013, pp. 971-982, vol. 48, No. 4.

Xu, B. et al., Background Calibration of Time-Interleaved ADC Using Direct Derivative Information, IEEE © 2013, pp. 2456-2459.

El-Chammas, M. et al., A 12-GS/s 81-mW 5-bit Time-Interleaved Flash ADC with Background Timing Skew Calibration, 2010 Symposium on VLSI Circuits/Technical Digest of Technical Papers, IEEE © 2010, pp. 157-158.

El-Chammas, M. et al., General Analysis on the Impact of Phase-Skew in Time-Interleaved ADCs, IEEE Transactions on Circuits and Systems-I: Regular Papers, May 2009, pp. 902-910, vol. 56. No. 5.

Iroaga, E. et al., A Background Correction Technique for Timing Errors in Time-Interleaved Analog-to-Digital Converters, IEEE © 2005, pp. 5557-5560.

Boulghassoul, Y. et al., Investigation of Millisecond-Long Analog Single-Event Transients in the LM6144 Op Amp, IEEE Transactions on Nuclear Science, Dec. 2004, pp. 3529-3536, vol. 51, No. 6.

Gibbons-Nef, T., The New DARPA Chip Could Give U.S. Leg Up in Electronic Warfare, The Washington Post, Jan. 12, 2016, 2 pages.

* cited by examiner

RADIATION-HARDENED INTERLEAVED ANALOG-TO-DIGITAL CONVERTER CIRCUITS AND METHODS OF CALIBRATING THE SAME

GOVERNMENT LICENSE RIGHTS

This invention was made with United States Government (USG) support. The government has certain rights in the invention.

BACKGROUND

The field of the disclosure relates generally to analog-to-digital converters (ADCs) and, more particularly, to a circuit and method of calibration of radiation-hardened time-interleaved ADCs.

Time-interleaved ADCs are composed of a plurality of ADC units ("slices") operated in parallel and require calibration to correct for, among other errors, sampling phase mismatch errors between the slices. Least Mean Squares (LMS) methods such as the following are employed for background calibration:

$$S_N[k+1] = S_N[k] + \mu \cdot \frac{dY}{dk} \cdot \text{Error}[k]$$

where $S_N$ is a phase adjustment coefficient of calibration stored into an accumulator, $\mu$ is the value of the accumulator gain, Y is an ADC slice output value, and k is a sampling time. The $S_N$ coefficient is used to numerically tune a DLL (Delay Locked Loop) that precisely controls the time edges of the clock waveforms, and thus the sampling instants, within each ADC slice. Both ADC implementations with a single, common multi-tap DLL driving all slices, and implementations where each slice contains instead its own local DLL are equally operational, making this aspect not functional to the invention. Calibration thus requires two registers: to retain memory of the previous ADC slice output value, and of the current ADC slice output value (under calibration). The time derivative approximation dY/dk is imprecise in many known calibration methods, and under certain conditions it potentially leads to incorrect evolution direction and significant error propagation, leading to divergence of the calibration process to the point of system failure. Such negative effects are worsened in closed-loop LMS-based calibration methods under, e.g., radiation conditions that cause single-event upsets (SEUs) in digital cells, due to heavy ion single-event effects (SEEs). Also, circuit implementations of ever increasing cost and complexity are required in modern applications demanding sampling frequencies into gigahertz (GHz) ranges, 10 bits or greater resolution, and phase calibration step sizes of the DLL down to 50 femtoseconds (fs) and below. As such, merely lowering the ADC input frequencies is no longer enough to resolve the aforementioned problems when calibrating time-interleaved ADCs, and designers face continued challenges meeting demands of modern applications exacerbated by SEU and SEE conditions.

BRIEF DESCRIPTION

In one aspect, an analog-to-digital converter (ADC) circuit is provided. The ADC circuit includes at least a first, a second, and a third ADC slice configured to sample an analog input signal and transmit a digitally converted signal thereof representative of a first, a second, and a third value of the analog input signal at a first, a second, and a third consecutively sampled time point thereof, respectively. The ADC circuit also includes at least one reference ADC slice configured to sample the analog input signal and transmit a digitally converted reference value to facilitate determining an error value. The ADC circuit further includes a first, a second, and a third register coupled to the first, second, and third ADC slices, and configured to store the first, second, and third values, respectively. The ADC circuit also includes a reference register coupled to the at least one reference ADC slice, and configured to store the reference value. The ADC circuit further includes a delay register having an input and an output, and configured to produce a sample time adjustment signal, where the sample time adjustment signal facilitates adjustment of a phase of a next time sampling of the analog input signal by the second ADC slice. The ADC circuit also includes a plurality of computational circuit elements coupled to the input and the output of the delay register, the first, second, and third registers, and the reference register, and configured to determine the error value, a value of an approximate time derivative of analog input signal estimated from the third, the second, and the first sampled time point, and a value of the sample time adjustment signal.

In another aspect, a method of calibrating an ADC is provided. The method includes consecutively sampling an analog input signal via at least a first, a second, and a third ADC slice. The method also includes sampling, via at least one reference ADC slice, the analog input signal. The method further includes transmitting, via the first, second, and third ADC slices, a first, a second, and a third digitally converted signal representative of a first, a second, and a third value of the analog input signal at a first, a second, and a third consecutively sampled time point thereof, respectively. The method also includes transmitting, via the at least one reference ADC slice, a digitally converted reference value to facilitate determining an error value. The method further includes storing, via a first, a second, and a third register coupled to the first, second, and third ADC slices, respectively, the first, second, and third values, respectively. The method also includes storing, via a reference register coupled to the at least one reference ADC slice, the reference value. The method further includes determining, via a plurality of computational circuit elements, the error value, a value of an approximate time derivative of the analog input signal estimated from the third, the second and the first sampled time point, and a value of a sample time adjustment signal. The method also includes transmitting, via the plurality of computational circuit elements, the sample time adjustment signal. The method further includes storing, via a delay register coupled to the plurality of computational circuit elements, the value of the sample time adjustment signal. The method also includes delaying by at least one cycle, via the delay register, a determination of a value of a change in a timing of the digitally converted signal. The method further includes producing and transmitting, via the delay register, the sample time adjustment signal to facilitate adjustment of a phase of a next time sampling of the analog input signal by the second ADC slice. The method also includes adjusting the phase of the next time sampling of the analog input signal by the second ADC slice.

In yet another aspect, an ADC circuit is provided. The ADC circuit includes at least a first and a second ADC slice configured to sample an analog input signal and transmit a digitally converted signal thereof representative of a first and a second value of the analog input signal at a first and a second consecutively sampled time point thereof, respectively. The ADC circuit also includes at least one reference ADC slice configured to sample the analog input signal and transmit a digitally converted reference value to facilitate determining an error value. The ADC circuit further includes a first and a second register coupled to the first and second ADC slices, and configured to store the first and second values, respectively. The ADC circuit also includes a reference register coupled to the at least one reference ADC slice, and configured to store the reference value. The ADC circuit further includes a delay reset register having an input, a reset input, and an output, and configured to produce a sample time adjustment signal and store and accumulate a value thereof, where the sample time adjustment signal facilitates adjustment of a phase of a next time sampling of the analog input signal by the second ADC slice. The ADC circuit also includes a comparator having a comparator output coupled to the reset input, a first input coupled to the output of the delay reset register, and a second input. The ADC circuit further includes a threshold register coupled to the second input, and configured to store a predetermined clamp value, the comparator configured to compare an accumulated value of the sample time adjustment signal to the clamp value. The comparator is further configured to transmit a reset signal from the comparator output to the reset input to facilitate resetting the accumulated value when at least one of the following outcomes of a comparator comparison occurs: the value of the sample time adjustment signal equals the clamp value, and the value of the sample time adjustment signal is greater than the clamp value. The ADC circuit also includes a plurality of computational circuit elements coupled to the input and the output of the delay reset register, the first and second registers, and the reference register, and configured to determine the error value, a value of an approximate time derivative of the analog input signal estimated from the second and the first sampled time point, and the value of the sample time adjustment signal.

In still another aspect, a method of calibrating an ADC is provided. The method includes consecutively sampling an analog input signal via at least a first and a second ADC slice. The method also includes sampling, via at least one reference ADC slice, the analog input signal. The method further includes transmitting, via the first and second ADC slices, digitally converted signals representative of a first and a second value of the analog input signal at a first and a second consecutively sampled time point thereof, respectively. The method also includes transmitting, via the at least one reference ADC slice, a digitally converted reference value to facilitate determining an error value. The method further includes storing, via a first and a second register coupled to the first and second ADC slices, respectively, the first and second values, respectively. The method also includes storing, via a reference register coupled to the at least one reference ADC slice, the reference value. The method further includes determining, via a plurality of computational circuit elements, the error value, a value of an approximate time derivative of the analog input signal estimated from the second and the first sampled time point, and a value of a sample time adjustment signal. The method also includes transmitting, via the plurality of computational circuit elements, the sample time adjustment signal. The method further includes storing, via a delay reset register coupled to the plurality of computational circuit elements, the value of the sample time adjustment signal. The method also includes delaying by at least one cycle, via the delay reset register, determination of a value of a change in a timing of the digitally converted signal. The method further includes storing, via a threshold register, a predetermined clamp value. The method also includes accumulating and storing, via the delay reset register, an accumulated value of the sample time adjustment signal. The method further includes comparing, via a comparator, the clamp value and the value of the sample time adjustment signal. The method also includes producing and transmitting, via the delay reset register, the sample time adjustment signal to facilitate adjustment of a phase of a next time sampling of the analog input signal by the second ADC slice. The method further includes adjusting the phase of the next time sampling of the analog input signal by the second ADC slice. The method also includes resetting, via the delay reset register, the accumulated value when at least one of the following outcomes of said comparing occurs: the value of the sample time adjustment signal equals the clamp value, and the value of the sample time adjustment signal is greater than the clamp value.

In yet another aspect, an ADC circuit is provided. The ADC circuit includes at least a first, a second, and a third ADC slice configured to sample an analog input signal and transmit a digitally converted signal thereof representative of a first, a second, and a third value of the analog input signal at a first, a second, and a third consecutively sampled time point thereof, respectively. The ADC circuit also includes at least one reference ADC slice configured to sample the analog input signal and transmit a digitally converted reference value to facilitate determining an error value. The ADC circuit further includes a first, a second, and a third register coupled to the first, second, and third ADC slices, and configured to store the first, second, and third values, respectively. The ADC circuit also includes a reference register coupled to the at least one reference ADC slice, and configured to store the reference value. The ADC circuit further includes a delay reset register having an input, a reset input, and an output, and configured to produce a sample time adjustment signal and store and accumulate a value thereof, where the sample time adjustment signal facilitates adjustment of a phase of a next time sampling of the analog input signal by the second ADC slice. The ADC circuit also includes a comparator having a comparator output coupled to the reset input, a first input coupled to the output of the delay reset register, and a second input. The ADC circuit further includes a threshold register coupled to the second input, and configured to store a predetermined clamp value, the comparator configured to compare an accumulated value of the sample time adjustment signal to the clamp value. The comparator is further configured to transmit a reset signal from the comparator output to the reset input to facilitate resetting the accumulated value when at least one of the following outcomes of a comparator comparison occurs: the value of the sample time adjustment signal equals the clamp value, and the value of the sample time adjustment signal is greater than the clamp value. The ADC circuit also includes a plurality of computational circuit elements coupled to the input and the output of the delay reset register, the first, second, and third registers, and the reference register, and configured to determine the error value, a value of an approximate time derivative of the analog input signal estimated from the third, the second and the first sampled time point, and the value of the sample time adjustment signal.

In still another aspect, a method of calibrating an ADC is provided. The method includes consecutively sampling an analog input signal via at least a first, a second, and a third ADC slice. The method also includes sampling, via at least one reference ADC slice, the analog input signal. The method further includes transmitting, via the first, second, and third ADC slices, digitally converted signals representative of a first, a second, and a third value of the analog input signal at a first, a second, and a third consecutively sampled time point thereof, respectively. The method also includes transmitting, via the at least one reference ADC slice, a digitally converted reference value to facilitate determining an error value. The method further includes storing, via a first, a second, and a third register coupled to the first, second, and third ADC slices, respectively, the first, second, and third values, respectively. The method also includes storing, via a reference register coupled to the at least one reference ADC slice, the reference value. The method further includes determining, via a plurality of computational circuit elements, the error value, a value of an approximate time derivative of the analog input signal estimated from the third, the second and the first sampled time point, and a value of a sample time adjustment signal. The method also includes transmitting, via the plurality of computational circuit elements, the sample time adjustment signal. The method further includes storing, via a delay reset register coupled to the plurality of computational circuit elements, the value of the sample time adjustment signal. The method also includes delaying by at least one cycle, via the delay reset register, determination of a value of a change in a timing of the digitally converted signal. The method further includes storing, via a threshold register, a predetermined clamp value. The method also includes accumulating and storing, via the delay reset register, an accumulated value of the sample time adjustment signal. The method further includes comparing, via a comparator, the clamp value and the value of the sample time adjustment signal. The method also includes producing and transmitting, via the delay reset register, the sample time adjustment signal to facilitate adjustment of a phase of a next time sampling of the analog input signal by the second ADC slice. The method further includes adjusting the phase of the next time sampling of the analog input signal by the second ADC slice. The method also includes resetting, via the delay reset register, the accumulated value when at least one of the following outcomes of said comparing occurs: the value of the sample time adjustment signal equals the clamp value, and the value of the sample time adjustment signal is greater than the clamp value.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 1 is a schematic illustration of an exemplary sinusoidal input signal to a time-interleaved analog-to-digital converter (ADC).

FIG. 2 is a schematic illustration of an exemplary time-interleaved ADC circuit implementing a three point calibration method.

FIG. 3 is a schematic illustration of an exemplary time-interleaved ADC circuit implementing a clamped watchdog two point calibration method.

FIG. 4 is a schematic illustration of an exemplary time-interleaved ADC circuit 400 implementing a three point calibration method with clamp.

FIG. 5 is an exemplary simulation plot of phase adjustment coefficient versus sample time for two point, two point with clamp, and three point calibration methods shown and described above in FIGS. 1-3.

FIG. 6 is an exemplary simulation plot of effective number of bits (ENOB) versus number of interleaved samples for the two point, two point with clamp, and three point calibration methods shown and described above in FIGS. 1-3.

Figure 1:
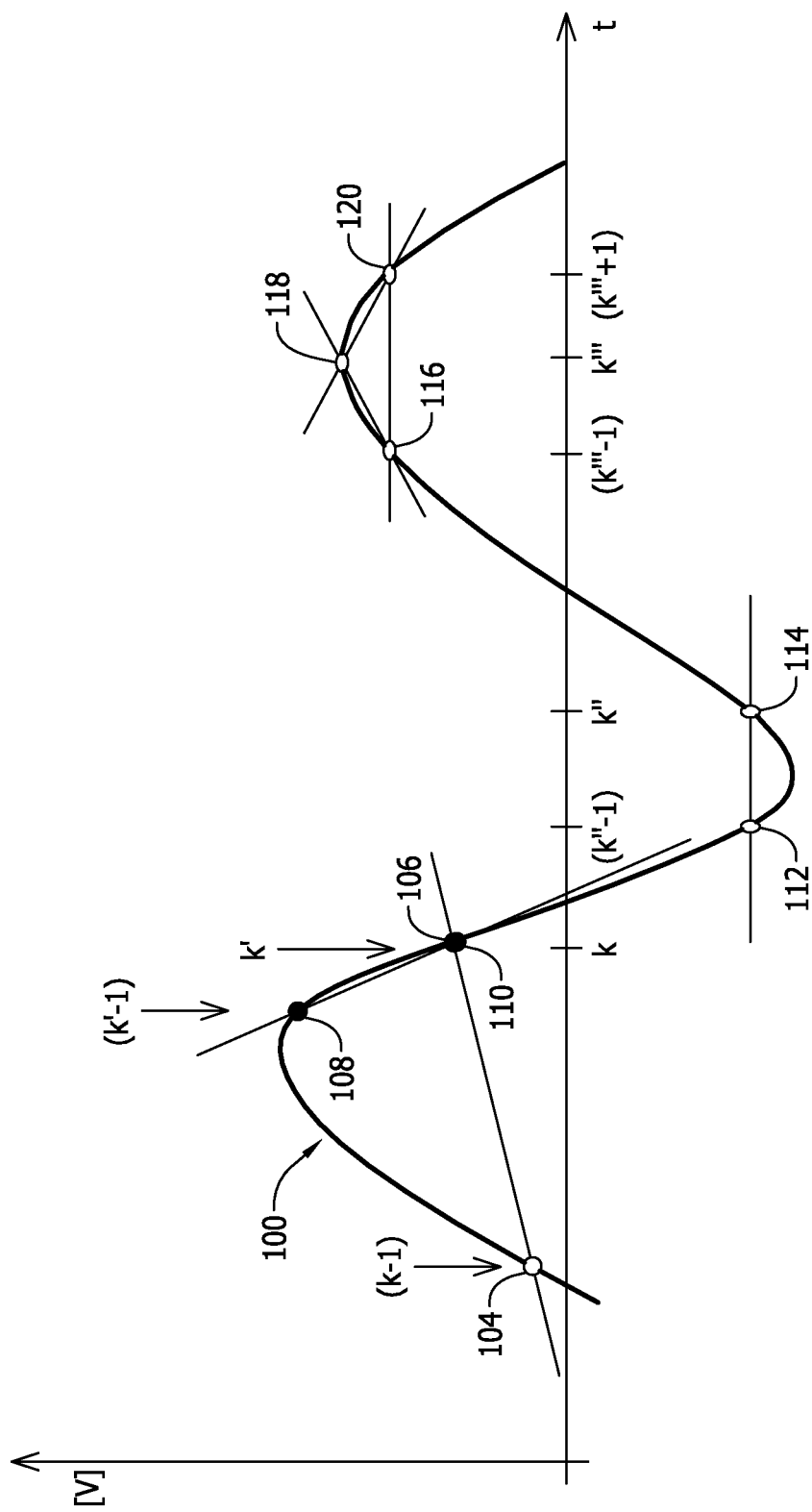
FIGS. 1-6 show example implementations of the apparatus and method described herein.

Although specific aspects or features of various implementations may be shown in some drawings and not in others, this is for convenience only. Any feature of any drawing may be referenced and/or claimed in combination with any other compatible feature of any other drawing or described in an implementation.

Unless otherwise indicated, the drawings provided herein are meant to illustrate features of implementations of the disclosure. These features are believed to be applicable in a wide variety of systems comprising one or more implementations of the disclosure. As such, the drawings are not meant to include all conventional features known by those of ordinary skill in the art to be required for the practice of the implementations disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, and such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the implementations described herein, the term "memory" and related terms, e.g., "register", may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the implementations described herein, additional input channels may be, but are not limited to, computer peripherals associated with an operator interface such as a mouse and a keyboard. Alternatively, other computer peripherals may also be used that may include, for example, but not be limited to, a scanner. Furthermore, in an exemplary implementation, additional output channels may include, but not be limited to, an operator interface monitor.

The following detailed description illustrates implementations of the disclosure by way of example and not by way of limitation. It is contemplated that the disclosure has general application to a circuits and methods for using and calibrating time-interleaved analog-to-digital converters (ADCs), including under operating conditions encompassing elevated potential for single-event effects (SEEs) and more in specific single-event upsets (SEUs).

Implementations of the radiation-hardened interleaved ADC circuits and methods of calibrating the same described herein effectively improve the precision of approximated time derivatives for Least Mean Squares (LMS)-based calibration. Also, the radiation-hardened interleaved ADC circuits and methods of calibrating the same described herein mitigate or prevent negative effects due to incorrect evolution direction and error propagation, thus yielding superior efficiency calibrations and preventing system failures, including, without limitation, under SEE operating conditions. Further, the radiation-hardened interleaved ADC circuits and methods of calibrating the same described herein improve speed, resolution, and reliability of time-interleaved ADCs without greatly increased circuit complexity and expense. Furthermore, the radiation-hardened interleaved ADC circuits and methods of calibrating the same described herein are very cost-effective solutions and are readily adaptable to both coarse DLLs (Delay Locked Loops) or very fine DLLs with either "round robin" or "auxiliary slice" operating schemes. Moreover, the radiation-hardened interleaved ADC circuits and methods of calibrating the same described herein are implementable in modern applications demanding sampling frequencies into gigahertz (GHz) ranges, 10 bit or greater resolution, and calibration step sizes down to 50 femtoseconds (fs) and below to yield higher resolution and lower distortion performance, and faster recovery time from SEEs or other disruptions such as power supply brownout.

FIG. 1 is a schematic illustration of an exemplary sinusoidal input signal 100 to a time-interleaved ADC (not shown). In an exemplary implementation, sinusoidal input signal 100 represents a sinusoidally-varying analog signal, including, without limitation, a voltage signal ([V]), on the y-axis plotted against time (t) on the x-axis. Also, in an exemplary implementation, it is possible to use a two point time derivative estimation method for calibration. The two points, point 104 and point 106, represent a first pair of ADC samples of sinusoidal input signal 100 taken at time (k−1) and time k, respectively. The time derivative dY/dt in this first case is approximated by the slope of a line intersecting point 104 and point 106. Further, in an exemplary implementation, a second pair of points, point 108 and point 110, represents a second pair of ADC samples of sinusoidal input signal 100 taken at a higher sampling frequency than the first pair of points (104, 106). Point 108 is taken at time (k'−1) and point 110 is taken at time k'. The time derivative dY/dt in this second case is approximated by the slope of a line intersecting point 108 and point 110. Likewise, a third pair of points, point 112 and point 114, represent a third pair of ADC samples of sinusoidal input signal 100, also taken at a higher sampling frequency than the first pair of points (104, 106). Point 112 is taken at time (k''−1) and point 114 is taken at time k''. The dY/dt in this third case is approximated by the slope of a line intersecting point 112 and point 114.

Also, in an exemplary implementation, it is possible to use a three point time derivative estimation method to be used by the ADC calibration algorithm. The three points, point 116, point 118, and point 120, represent three ADC samples of sinusoidal input signal 100 taken at about the same sampling frequency as the third pair of points (112, 114). Point 116 is taken at time (k'''−1), point 118 is taken at time k''', and point 120 is taken at point (k'''+1). Further, in an exemplary implementation, with the three point time derivative approximation, i.e., calibration, method, two different approximations of the time derivative are possible. First, dY/dt at time k''' at point 118 with respect to time (k'''−1) at point 116 is approximated by the slope of a line intersecting point 116 and point 118. Second, dY/dt at time k''' at point 118 with respect to time (k'''−1) at point 116 and time (k'''+1) at point 120 is approximated by the slope of a line intersecting precursor point 116 and successor point 120.

In operation, in an exemplary implementation, approximating the time derivative using only two points provides a less precise approximation of dY/dt than using a three point calibration method. For example, ADC sampling sinusoidal input signal 100 at times (k−1) and k does not capture information about the signal due to a lower sampling frequency being used: the slope of sinusoidal input signal 100 waveform should be negative at point 110, while the slope estimate after coarsely sampled points (k−1) and k is positive. ADC sampling sinusoidal input signal 100 at times (k'−1) and k' using a higher frequency mitigates the missing information effect to some extent and results in a more precise estimate of dY/dt: the slope of sinusoidal input signal 100 waveform is at least correctly identified as negative for time k'. However, even at higher ADC sampling frequencies, the two point method still potentially excludes important information from ADC calibration. For instance, the approximation of dY/dt at point 114 with respect to point 112 does not take into account the signal change between point 112 and the minimum of sinusoidal input signal 100 between point 112 and point 114. Indeed, in an exemplary implementation, the slope of the line intersecting point 112 and point 114 is very near zero, which is not fully representative of the dynamics of sinusoidal input signal 100 between point 112 and point 114, and of the desired slope at point 114, herein labeled k'', which is positive. Thus, the two point method does not result in as precise an approximation of dY/dt as the three point calibration does.

Also, in operation of an exemplary implementation, the two point method of approximation of dY/dt for discretely and consecutively sampled time points of sinusoidal input signal 100 used by known time-interleaved ADCs is used within an LMS phase adjustment coefficient operation that gauges the error between the output code, i.e., value of the digitally converted signal, of every (non-ideal) ADC slice, and the output code of a previously trimmed or pre-calibrated reference slice (idealized):

$$S_N[k+1] = S_N[k] + \mu \cdot \frac{dY}{dk} \cdot \text{Error}[k]$$

where $S_N$ is a phase adjustment coefficient of calibration stored into an accumulator, $\mu$ is the value of an accumulator gain, Y is an ADC output value, and k is a sampling time. Since the value of Error was evaluated at time k, it is of paramount importance both to the efficacy and convergence of the calibration method that the estimate of dY/dt be performed at time k as well, with as little time lead or time lag effects congenital to the approximated method of calculation of derivative dY/dt as possible.

Further, in operation of an exemplary implementation, the three point calibration method using point 116, point 118, and point 120 in sinusoidal input signal 100 is advantageous over the aforementioned two point calibration method. In particular, with ADC sampling sinusoidal input signal 100 at the same frequency as ADC sampled point 112 and point 114, more information about the dynamic change of sinusoidal input signal 100 may be utilized to yield a more precise calibration. For instance, by approximating dY/dt of point 118 with respect to point 116 and point 120 by the slope of the line intersecting point 116 and point 120, the maximum (i.e., zero derivative) between point 116 and point 120 is taken into account by the three point method since the estimate of the slope at point 118 is, indeed, very near zero. Thus, the three point calibration method makes use of more relevant information about analog input signals, including, without limitation, sinusoidal input signal 100, and a more precise calibration is thus achieved relative for point 118 as compared to the two point method.

Furthermore, in operation of an exemplary implementation, with the two-point calibration method, there is a half sampling period delay between the sampling time point at which dY/dt is calculated and the time at which the error is calculated, e.g.:

$$\frac{dY}{dt} \approx Y[k'] - Y[k'-1]$$

By adding a third sample time point in the three point calibration method, it is possible to average the dY/dt between times (k"−1) and k'" with the dY/dt between (k'"+1) and k'". As such, this averaging yields an approximation of dY/dt between times (k'"+1) and (k"−1) by the same mathematical symmetry leading to the aforementioned half sample period delay inherent in the two point calibration method. Therefore, with the three point calibration method, both the error and the approximation of dY/dt are calculated at the same sampling time point, namely, time k'", i.e., at point 118:

$$\frac{dY}{dt} \approx Y[k'''+1] - Y[k'''-1]$$

These attributes of the three point calibration method improve spectral characteristics of the time-interleaved ADC calibration method relative to two point methods including, without limitation, as used with sinusoidal input signals 100. Moreover, the three point method is more robust than two point calibration methods including, without limitation, with respect to SEE and, in particular, SEU events, as further shown and described below with respect to FIGS. 5 and 6.

Figure 2:
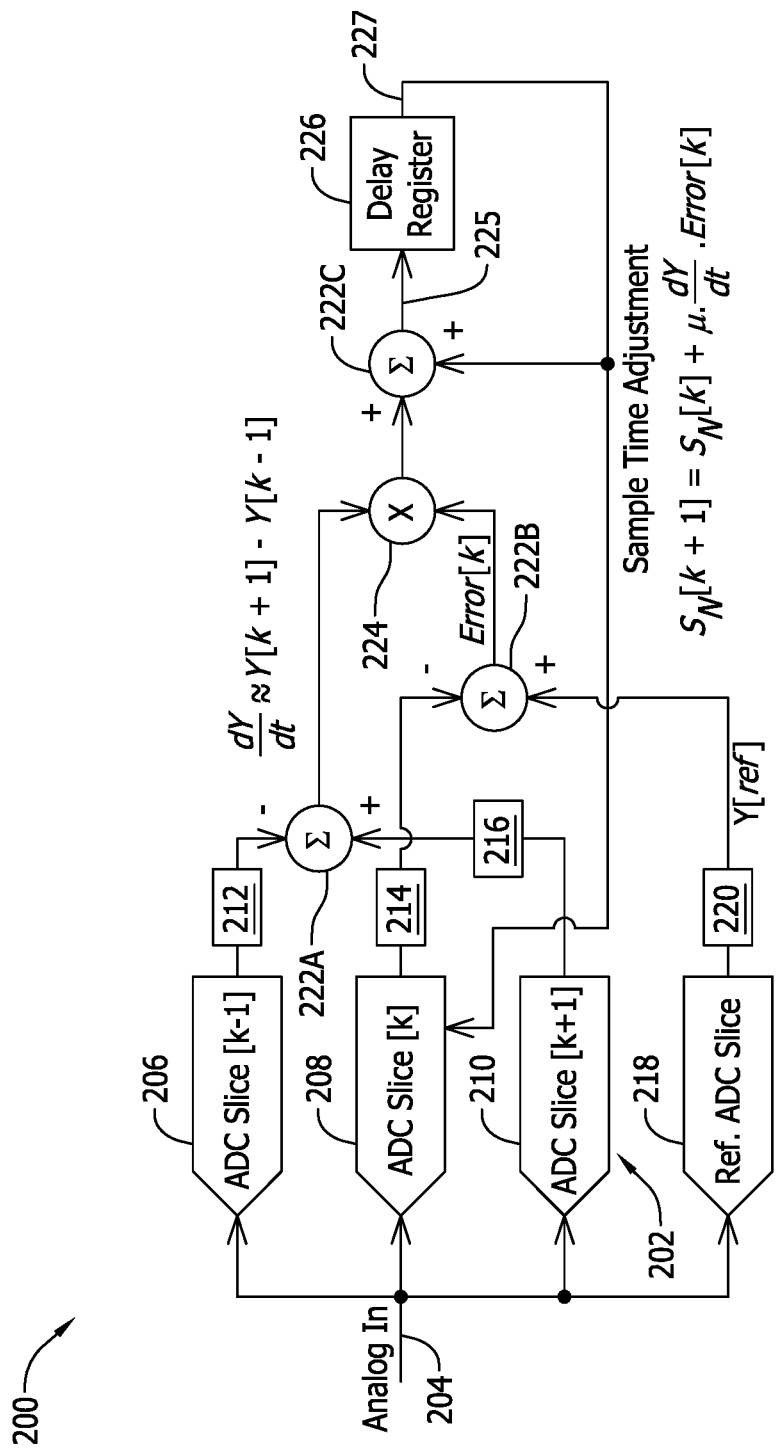

FIG. 2 is a schematic illustration of an exemplary time-interleaved ADC circuit 200 implementing a three point calibration method. In an exemplary implementation, time-interleaved ADC circuit 200 includes a first plurality of ADC slices 202. Each ADC slice 202 of first plurality of ADC slices 202 is configured to discretely and consecutively sample an analog input signal 204 including, without limitation, a continuous signal of a voltage level versus time, such as sinusoidal input signal 100 (not shown). Each ADC slice 202 of first plurality of ADC slices 202 is further configured to sample analog input signal 204 at a predetermined sampling frequency and output a digitally converted value thereof. Also, in an exemplary implementation, the sampling frequencies at which each ADC slice 202 of first plurality of ADC slices 202 samples analog input signal 204 are equal. In an implementation (not shown), the sampling frequencies at which each ADC slice 202 of first plurality of ADC slices 202 samples analog input signal 204 are not equal. In such an implementation, two ADC slices 202 of the three ADC slices 202 shown in FIG. 2 have equal sampling frequencies. In another implementation, all ADC slices 202 of the three ADC slices 202 shown in FIG. 2 have different sampling frequencies.

Also, in an exemplary implementation, time-interleaved ADC circuit 200 samples analog input signal 204 at sequential and substantially equally spaced points in time on a time scale (not shown). For instance, a first ADC slice 206 samples analog input signal 204 at a first point in time, i.e., (k−1). A second ADC slice 208 samples analog input signal 204 at a second point in time, i.e., k. Likewise, a third ADC slice 210 samples analog input signal 204 at a third point in time, i.e., (k+1). First ADC slice 206 includes a first register 212 coupled thereto into which first ADC slice 206 transmits and stores its sampled and digitally converted value. Second ADC slice 208 includes a second register 214 coupled thereto into which second ADC slice 208 transmits and stores its sampled and digitally converted value. Third ADC slice 210 includes a third register 216, i.e., an additional register, coupled thereto into which third ADC slice 210 stores its sampled and digitally converted value.

Further, in an exemplary implementation, time-interleaved ADC circuit 200 includes a reference ADC slice 218. Reference ADC slice 218 is configured to sample analog input signal 204 and output a digitally converted and predetermined reference value for use in determining a value of an error for purposes of calibrating time-interleaved ADC circuit 200, as described below. Reference ADC slice 218 includes a reference register 220 coupled thereto into which the reference value is transmitted and stored. Time-interleaved ADC circuit 200 also includes a plurality of computational circuit elements. The plurality of computational circuit elements includes a first plurality of summers 222 (222A-222C) configured to add and subtract values of a first, a second, and a third sampled ADC output signal stored in first register 212, second register 214, and third register 216, respectively (i.e., a first, second, and third value, respectively), and the reference value stored in reference register 220. Summers 222A-222C thus determine sums and differences of sampled values of first ADC slice 206, second ADC slice 208, third ADC slice 210, and reference ADC slice 218. In an exemplary implementation, the aforementioned first, second, third, and reference values stored as data in at least one of first register 212, second register 214, third register 216, and reference register 220 are representative of analog values of analog input signal 204 at discretely and consecutively sampled time points thereof, respectively. In an implementation (not shown), the aforementioned ADC output signals are representative of values that are not representative of value stored as data in at least one of first register 212, second register 214, third register 216, and reference register 220, including, without limitation, values which underwent further transformation and/or modification by operations performed by software-implemented instructions stored in memory and implemented via one or more processors (not shown), in time-interleaved ADC circuit 200.

Furthermore, in an exemplary implementation, first plurality of summers 222 includes a first summer 222A, a second summer 222B, and a third summer 222C. First summer 222A is coupled to and between first register 212 and third register 216. A first summer output signal of summer 222A is a digital signal representative of an approximate time derivative, denoted dY/dt in FIG. 2 (i.e., an approximate time derivative of the third sampled time point with respect to the first sampled time point). First summer 222A determines, i.e., computes, approximate dY/dt by subtracting a digitally represented value of analog input signal 204 sampled by first ADC slice 206 at time (k−1), including, without limitation, a sampled analog voltage value Y[k−1], from a digitally represented value of analog input signal 204 sampled by third ADC slice 210 at time (k+1), i.e., Y[k+1]. As such, first summer output signal is representative of approximated dY/dt as follows:

$$\frac{dY}{dt} \approx Y[k+1] - Y[k-1]$$

Second summer 222B is coupled to and between second register 214 and reference register 220. A second summer output signal of second summer 222B is a digital signal representative of an error value at time k, denoted "Error[k]" in FIG. 2. Second summer 222B determines Error by subtracting a digitally represented value of analog input signal 204 sampled by second ADC slice 208 at time k, i.e., Y[k], from a digitally represented value output by reference ADC slice 218, i.e., Y[ref]. As such, second summer output signal is representative of Error at time k as follows:

Error[k]=Y[ref]−Y[k]

Moreover, in an exemplary implementation, the plurality of computational circuit elements in time-interleaved ADC circuit 200 also includes a multiplier 224. A multiplier output of multiplier 224 is a digital signal representative of a product of Error and approximated dY/dt. Third summer 222C is coupled to and between multiplier 224 and an input 225 of a delay register 226. A third summer output signal of third summer 222C is transmitted to input 225 of delay register 226 to be stored therein for at least one clock cycle. An output 227 of delay register 226 is coupled to third summer 222C and second ADC slice 208.

In operation, in an exemplary implementation, time-interleaved ADC circuit 200 utilizes third register 216, i.e., an additional register, to maintain a memory of a converted and digitally represented value of the third sampled value taken by third ADC slice 210 at time (k+1) to be used in later mathematical operations performed by the plurality of computational circuit elements for calibration purposes. Also, in operation of an exemplary implementation, the presence of third register 216, concomitant with the presence of second register 214, permits the three point calibration method to be carried out in time-interleaved ADC circuit 200 in a revolving sampled-time basis including, without limitation, in a "round robin" scheme.

Also, in operation of an exemplary implementation, delay register 226 produces and, via output 227, transmits a sample time adjustment signal. Delay register 226 thus facilitates time-interleaved ADC circuit 200 to adjust the sample time, i.e., phase, of the next time k sampling of analog input signal 204 by the following mathematical operation implemented by first, second, and third summers (222A, 222B, 222C), multiplier 224, and delay register 226, or alternatively as software-based instructions stored in a memory and implemented by at least one processor in time-interleaved ADC circuit 200:

$$S_N[k+1] = S_N[k] + \mu \cdot \frac{dY}{dt} \cdot \text{Error}[k]$$

Sample time adjustment signal therefore enables calibration of time-interleaved ADC circuit 200 for a next time sample taken of analog input signal 204 by second ADC slice 208 at the next iteration of a revolving sampled-time basis including, without limitation, in a "round robin" scheme. As a result of the aforementioned phase adjustment, subsequent analog input signal 204 sampling times are adjusted in kind, until such sampling time where additional phase adjustments are necessary for purposes of calibration of time-interleaved ADC circuit 200. Further, in operation of an exemplary implementation, delay register 226 transmits sample time adjustment signal to at least one of first, second, and third ADC slices (206, 208, 210) at every ADC sampling clock cycle thereof, such that each consecutive time sampling of analog input signal 204 by second ADC slice 208 may be so adjusted, if necessary. In an implementation (not shown), delay register 226 transmits sample time adjustment signal at timed intervals other than once per ADC sampling clock cycle, including, without limitation, more than once per ADC sampling clock cycle, and less than once per ADC sampling clock cycle.

Further, in operation of an exemplary implementation, upon completion of the three point method for discretely and consecutively sampled time points of analog input signal 204 under calibration, the contents, i.e., digital data stored in first register 212, second register 214, and third register 216 are naturally overwritten by the immediate next round of calibration to be performed in time-interleaved ADC circuit 200. In an implementation (not shown), at least one of first register 212, second register 214, and third register 216 stores more than one converted value sampled by first ADC slice 206, second ADC slice 208, and third ADC slice 210, respectively. In such an implementation, such additional sampled values may be maintained in the registers for a specified period of time or for a specified number of calibrations of time-interleaved ADC circuit 200 to enable advantageous higher-order slope estimates. Use of the three point calibration methodology in time-interleaved ADC circuit 200 provides effective protection of the calibration convergence trajectory and mitigation of error propagation for high speed and high resolution ADCs including under operating conditions encompassing elevated potential for SEEs and in particular SEUs.

Figure 3:
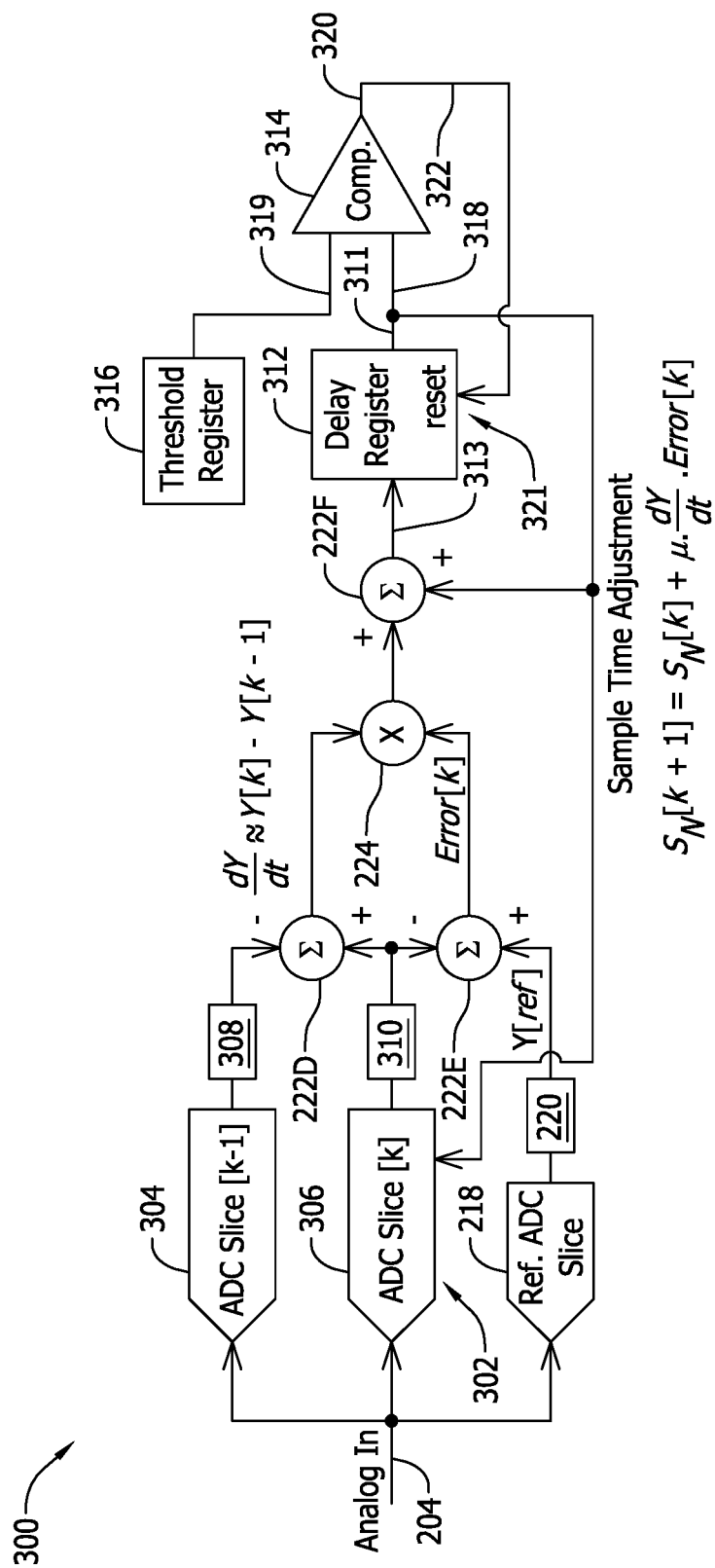

FIG. 3 is a schematic illustration of an exemplary time-interleaved ADC circuit 300 implementing a clamped watchdog two point calibration method. In an exemplary implementation, time-interleaved ADC circuit 300 includes a second plurality of ADC slices 302. Each ADC slice 302 of second plurality of ADC slices 302 is configured to discretely and consecutively sample an analog input signal 204 including, without limitation, a continuous signal of a voltage level versus time, such as sinusoidal input signal 100 (not shown). Each ADC slice 302 of second plurality of ADC slices 302 is further configured to sample analog input signal 204 at a predetermined sampling frequency and output a digitally converted value thereof. Also, in an exemplary implementation, the sampling frequencies at which each ADC slice 302 of second plurality of ADC slices 302 samples analog input signal 204 are equal. In an implementation (not shown), the sampling frequencies at which each ADC slice 302 of second plurality of ADC slices 302 samples analog input signal 204 are not equal. In such an implementation, both ADC slices 302 of the two ADC slices 302 shown in FIG. 3 have equal sampling frequencies. In another implementation, each ADC slice 302 of the two ADC slices 302 shown in FIG. 3 has a different sampling frequency.

Also, in an exemplary implementation, time-interleaved ADC circuit 300 samples analog input signal 204 at sequential and substantially equally spaced points in time on a time scale (not shown). For instance, a first ADC slice 304 samples analog input signal 204 at a first point in time, i.e., (k−1). A second ADC slice 306 samples analog input signal 204 at a second point in time, i.e., k. First ADC slice 304 includes a first register 308 coupled thereto into which first ADC slice 304 transmits and stores its sampled and digitally converted value. Second ADC slice 306 includes a second register 310 coupled thereto into which second ADC slice 306 transmits and stores its sampled and digitally converted value.

Further, in an exemplary implementation, time-interleaved ADC circuit 300 includes reference ADC slice 218. Reference ADC slice 218 is configured to sample analog input signal 204 and output a digitally represented and predetermined reference value for use in determining a value of an error for purposes of calibrating time-interleaved ADC circuit 300, as described below. Reference ADC slice 218 includes reference register 220 coupled thereto into which the reference value is transmitted and stored. Time-interleaved ADC circuit 300 also includes a plurality of computational circuit elements. The plurality of computational circuit elements includes a second plurality of summers 222 (222D-222F) configured to add and subtract values of a first and a second sampled ADC output signal stored in first register 308 and second register 310, respectively (i.e., a first and a second value, respectively), and the reference value stored in reference register 220. Summers (222D-222F) thus determined sums and differences of sampled values of first and second ADC slices (304 and 306), and reference ADC slice 218. In an exemplary implementation, the aforementioned first, second, and reference values stored as data in at least one of first register 308, second register 310, and reference register 220 are representative of analog values of analog input signal 204 at discretely and consecutively sampled time points thereof, respectively. In an implementation (not shown), the aforementioned ADC signals that are not representative of value stored as data in at least one of first register 308, second register 310, and reference register 220, including, without limitation, values which underwent further transformation and/or modification by operations performed by software-implemented instructions stored in memory and implemented via one or more processors (not shown), in time-interleaved ADC circuit 300.

Furthermore, in an exemplary implementation, second plurality of summers 222 includes a first summer 222D, a second summer 222E, and a third summer 222F. First summer 222D is coupled to and between first register 308 and second register 310. A first summer output signal of summer 222D is a digital signal representative of an approximated time derivative, denoted dY/dt in FIG. 3 (i.e., an approximate time derivative of the second sampled time point with respect to the first sampled time point). First summer 222D determines, i.e., computes, approximate dY/dt by subtracting a digitally represented value of analog input signal 204 sampled by first ADC slice 304 at time (k−1), including, without limitation, a sampled analog voltage value Y[k−1], from a digitally represented value of analog input signal 204 sampled by second ADC slice 306 at time k, i.e., Y[k]. As such, first summer output signal is representative of approximated dY/dt as follows:

$$\frac{dY}{dt} \approx Y[k] - Y[k-1]$$

Second summer 222E is coupled to and between second register 310 and reference register 220. A second summer output signal of second summer 222E is a digital signal representative of an error value at time k, denoted "Error[k]" in FIG. 3. Second summer 222E determines Error by subtracting a digitally represented value of analog input signal 204 sampled by second ADC slice 306 at time k, i.e., Y[k], from a digitally represented value output by reference ADC slice 218, i.e., Y[ref]. As such, second summer output signal is representative of Error at time k as follows:

Error[k]=Y[ref]−Y[k]

Moreover, in an exemplary implementation, the plurality of computational circuit elements in time-interleaved ADC circuit 300 also includes a multiplier 224. A multiplier output of multiplier 224 is a digital signal representative of a product of Error and approximated dY/dt. Third summer 222F is coupled to and between multiplier 224 and an output 311 of delay reset register 312. A third summer output signal of third summer 222F is transmitted to an input 313 of delay reset register 312 to be stored therein for at least one clock cycle. Time-interleaved ADC circuit 300 also includes a comparator 314 and a threshold register 316. Output 311 of delay reset register 312 is coupled to a first input 318 of a comparator 314. An output of a threshold register 316 is coupled to a second input 319 of comparator 314. A comparator output 320 of comparator 314 is coupled to a reset input 321 of delay reset register 312.

In operation of an exemplary implementation, first ADC slice 304 and second ADC slice 306 use first register 308 and second register 310, respectively, to maintain a memory of digitally represented converted values of sampled analog input signal 204 at times (k−1) and k, respectively. Storing sampled values from time (k−1) and k enables determination, i.e., computation, of approximate dY/dt and Error in time-interleaved ADC circuit 300. Also, in operation of an exemplary implementation, time-interleaved ADC circuit 300 utilizes threshold register 316 to store as data in memory a predetermined, i.e., user-defined, clamp value. Clamp value is a maximum allowable value of an accumulated value of data stored in delay reset register 312, i.e., an upper limit on a value of a phase adjustment coefficient. Delay reset register 312 outputs its accumulated value to comparator 314. Comparator 314 compares accumulated value with clamp value. Through this comparator functionality of comparator 314, if accumulated value equals or exceeds (depending on a user-defined configuration of comparator 314) clamp value, comparator 314 transmits a reset signal 322 to reset input 321 of delay reset register 312.

Also, in operation of an exemplary implementation, upon receipt of reset signal 322 by delay reset register 312, accumulated value stored in delay reset register 312 is reset (i.e., zeroed out, or reset to an otherwise suitable known value), and accumulation is recommenced from zero or from such known value until such time when and if accumulated value again equals or exceeds clamp value. By way of example only, if clamp value is set to 50 by a user of time-interleaved ADC circuit 300, comparator 314 transmits reset signal 322 to reset input 321 of delay reset register 312 upon accumulated value equaling 50. In another implementation (not shown), accumulated value is reset to zero upon accumulated value reaching a value that is greater than, rather than equal to, 50. As such, time-interleaved ADC circuit implements a reset function as part of the clamped, i.e., "watchdog"-reset, calibration scheme.

Further, in operation of an exemplary implementation, delay reset register 312 produces, and via output 311, transmits sample time adjustment signal. Delay reset register 312 thus facilitates time-interleaved ADC circuit 300 to adjust the sample time, i.e., phase, of the next time k sampling of analog input signal 204 by the following mathematical operation implemented by first, second, and third summers (222D, 222E, 222F), multiplier 224, and delay reset register 312, or alternatively as software-based instructions stored in memory and implemented by at least one processor in time-interleaved ADC circuit 300:

$$S_N[k+1] = S_N[k] + \mu \cdot \frac{dY}{dt} \cdot \text{Error}[k]$$

Sample time adjustment signal therefore enables calibration of time-interleaved ADC circuit 300 for a next time sample taken of analog input signal 204 by second ADC slice 306 at the next iteration of a revolving sampled-time basis including, without limitation, in a "round robin" scheme. As a result of the aforementioned phase adjustment, subsequent analog input signal 204 sampling times are adjusted in kind, until such sampling time where additional phase adjustments are necessary for purposes of calibration of time-interleaved ADC circuit 300. Further, in operation of an exemplary implementation, delay reset register 312 transmits sample time adjustment signal to at least one of first and second ADC slices (304, 306) at every ADC sampling clock cycle thereof, such that each consecutive time sampling of analog input signal 204 by second ADC slice 306 may be so adjusted, if necessary. In an implementation (not shown), delay reset register 312 transmits sample time adjustment signal at timed intervals other than once per ADC sampling clock cycle, including, without limitation, more than once per ADC sampling clock cycle, and less than once per ADC sampling clock cycle.

Moreover, in operation of an exemplary implementation, upon completion of the two point method with clamp for the discretely and consecutively sampled time points of analog input signal 204 under calibration, the contents, i.e., digital data stored in, first register 308 and second register 310 are naturally overwritten by the immediate next round of calibration to be performed in time-interleaved ADC circuit 300. In an implementation (not shown), at least one of first register 308 and second register 310 stores more than one converted value sampled by first ADC slice 304 and second ADC slice 306, respectively. In such an implementation, such additional sampled values may be maintained in the registers for a specified period of time or for a specified number of calibrations of time-interleaved ADC circuit 300. Use of the above described clamped, i.e., "watchdog"-reset, two point calibration methodology in time-interleaved ADC circuit 300 improves the two point calibration method, including, without limitation, two point calibration methods for "round robin" and "auxiliary slice" schemes, and enhances resiliency against detrimental radiation effects such as those resulting from SEEs and in particular SEUs.

Figure 4:
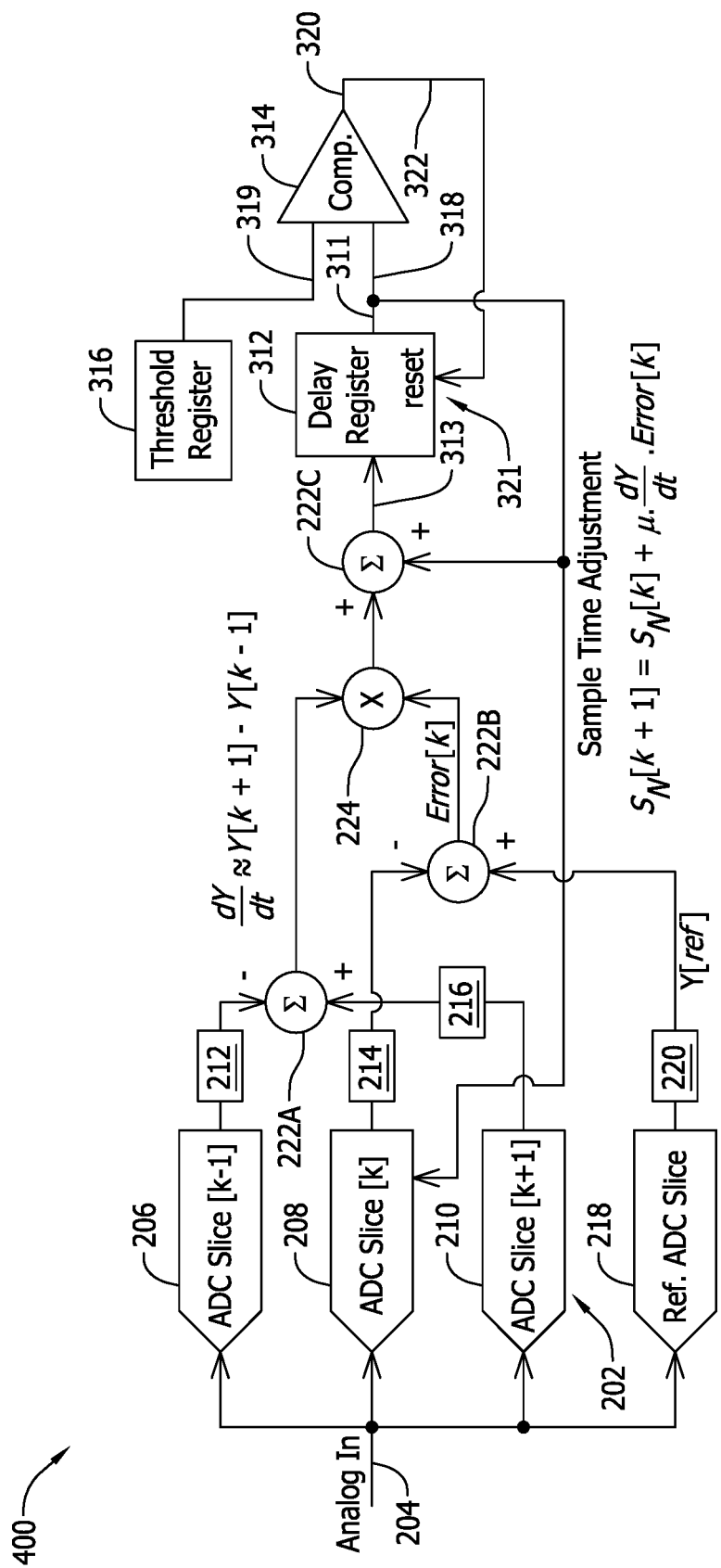

FIG. 4 is a schematic illustration of an exemplary time-interleaved ADC circuit 400 implementing a three point calibration method with clamp. In an exemplary implementation, time-interleaved ADC circuit 400 includes first plurality of ADC slices 202, first register 212, second register 214, third register 216, reference ADC slice 218, and reference register 220, all of which are coupled and configured for use in time-interleaved ADC circuit 400 as shown and described above with reference to FIG. 2. Time-interleaved ADC circuit 400 also the plurality of computational circuit elements. The plurality of computational circuit elements includes first plurality of summers 222 (222A-222C) and multiplier 224, all of which are coupled and configured for use in time-interleaved ADC circuit 400 as shown and describe above with reference to FIG. 2. In an exemplary implementation, first summer output of first summer 222A is a digital signal representative of approximate dY/dt, also as shown and described above with reference to FIG. 2. Second summer output of second summer 222B is a digital signal representative of Error, and multiplier output of multiplier 224 is a digital signal representative of a product of Error and approximated dY/dt, again as shown and described above with reference to FIG. 2.

Also, in an exemplary implementation, time-interleaved ADC circuit 400 also includes third summer 222C coupled to input 313 of delay reset register 312. Delay reset register 312 includes reset input 321. Output 311 of delay reset register 312 is coupled to first input 318 of comparator 314, as shown and described above with reference to FIG. 3. Threshold register 316 is coupled to second input 319 of comparator 314, and comparator output 320 is coupled to reset input 321, also as shown and described above with reference to FIG. 3.

In operation, in an exemplary implementation, time-interleaved ADC circuit 400 utilizes third register 216, i.e., an additional register, to maintain a memory of a converted and digitally represented value of the third sampled value taken by third ADC slice 210 at time (k+1) to be used in later mathematical operations for calibration purposes. Also, in operation of an exemplary implementation, the presence of third register 216 concomitant with the presence of second register 214, permits the three point calibration method to be carried out in time-interleaved ADC circuit 400 in a revolving sampled-time basis including, without limitation, in a "round robin" scheme.

Also, in operation of an exemplary implementation, reference ADC slice 218, first ADC slice 206, second ADC slice 208, and third ADC slice 210 use their respective registers (220, 212, 214, and 216) to maintain a memory of digitally represented converted values of Y[ref] and sampled analog input signal 204 at times (k−1), k, and (k+1), respectively. Storing Y[ref] and sampled values from times (k−1), k, and (k+1) enables determination of approximate dY/dt and Error in time-interleaved ADC circuit 400. Also, in operation of an exemplary implementation, time-interleaved ADC circuit 400 utilizes threshold register 316 to store as data in memory a predetermined, i.e., user-defined, clamp value. Clamp value is a maximum allowable value of an accumulated value of data stored in delay reset register 312, i.e., an upper limit on the value of the phase adjustment coefficient. Delay reset register 312 outputs its accumulated value to comparator 314. Comparator 314 compares accumulated value with clamp value. Through this comparator functionality of comparator 314, if accumulated value equals, or exceeds (depending on a user-defined configuration of comparator 314) clamp value, comparator 314 transmits a reset signal 322 to reset input 321 of delay reset register 312.

Further, in operation of an exemplary implementation, upon receipt of reset signal 322, accumulated value stored in delay reset register 312 is reset (i.e., zeroed out, or reset to an otherwise suitable known value), and accumulation is recommenced from zero or from such known value until such time when and if accumulated value again equals or exceeds clamp value. By way of example only, if clamp value is set to 50 by a user of time-interleaved ADC circuit 400, comparator 314 transmits reset signal 322 to reset input 321 of delay reset register 312 upon accumulated value equaling 50. In another implementation (not shown), accumulated value is reset to zero upon accumulated value reaching a value that is greater than, rather than equal to, 50. As such, time-interleaved ADC circuit implements a reset function as part of the clamped, i.e., "watchdog"-reset, calibration scheme.

Furthermore, in operation of an exemplary implementation, delay reset register 312 produces, and via output 311, transmits sample time adjustment signal. Delay reset register 312 thus facilitates time-interleaved ADC circuit 400 to adjust the sample time, i.e., phase, of the next time k sampling of analog input signal 204 by the following mathematical operation implemented by first, second, and third summers (222A-222C), multiplier 224, and delay reset register 312, or alternatively as software-based instructions stored in memory and implemented by at least one processor in time-interleaved ADC circuit 400:

$$S_N[k+1] = S_N[k] + \mu \cdot \frac{dY}{dt} \cdot \text{Error}[k]$$

Sample time adjustment signal therefore enables calibration of time-interleaved ADC circuit 400 for a next time sample taken of analog input signal 204 by second ADC slice 208 at the next iteration of a revolving sampled-time basis including, without limitation, in a "round robin" scheme. As a result of the aforementioned phase adjustment, subsequent analog input signal 204 sampling times are adjusted in kind, until such sampling time where additional phase adjustments are necessary for purposes of calibration of time-interleaved ADC circuit 400. Further, in operation of an exemplary implementation, delay reset register 312 transmits sample time adjustment signal to at least one of first, second, and third ADC slices (206, 208, 210) at every ADC sampling clock cycle thereof, such that each consecutive time sampling of analog input signal 204 by second ADC slice 208 may be so adjusted, if necessary. In an implementation (not shown), delay reset register 312 transmits sample time adjustment signal at timed intervals other than once per ADC sampling clock cycle, including, without limitation, more than once per ADC sampling clock cycle, and less than once per ADC sampling clock cycle.

Moreover, in operation of an exemplary implementation, upon completion of the three point calibration method with clamp for the discretely and consecutively sampled time points of analog input signal 204 under calibration, the contents, i.e., digital data stored in, first register 212, second register 214, and third register 216 are naturally overwritten by the immediate next round of calibration to be performed in time-interleaved ADC circuit 400. In an implementation (not shown), at least one of first register 212, second register 214, and third register 216 stores more than one converted value sampled by first ADC slice 206, second ADC slice 208, and third ADC slice 210, respectively. In such an implementation, such additional sampled values may be maintained in the registers for a specified period of time or for a specified number of calibrations of time-interleaved ADC circuit 400 to enable advantageous higher-order slope estimates. Use of the above described clamped, i.e., "watchdog"-reset, three point calibration methodology in time-interleaved ADC circuit 400 provides additional flexibility in applications requiring calibration of time-interleaved ADC circuits, including, without limitation, three point calibration methods for "round robin" and "auxiliary slice" schemes, and enhances resiliency against detrimental radiation effects such as those resulting from SEEs and in particular SEUs.

Figure 5:
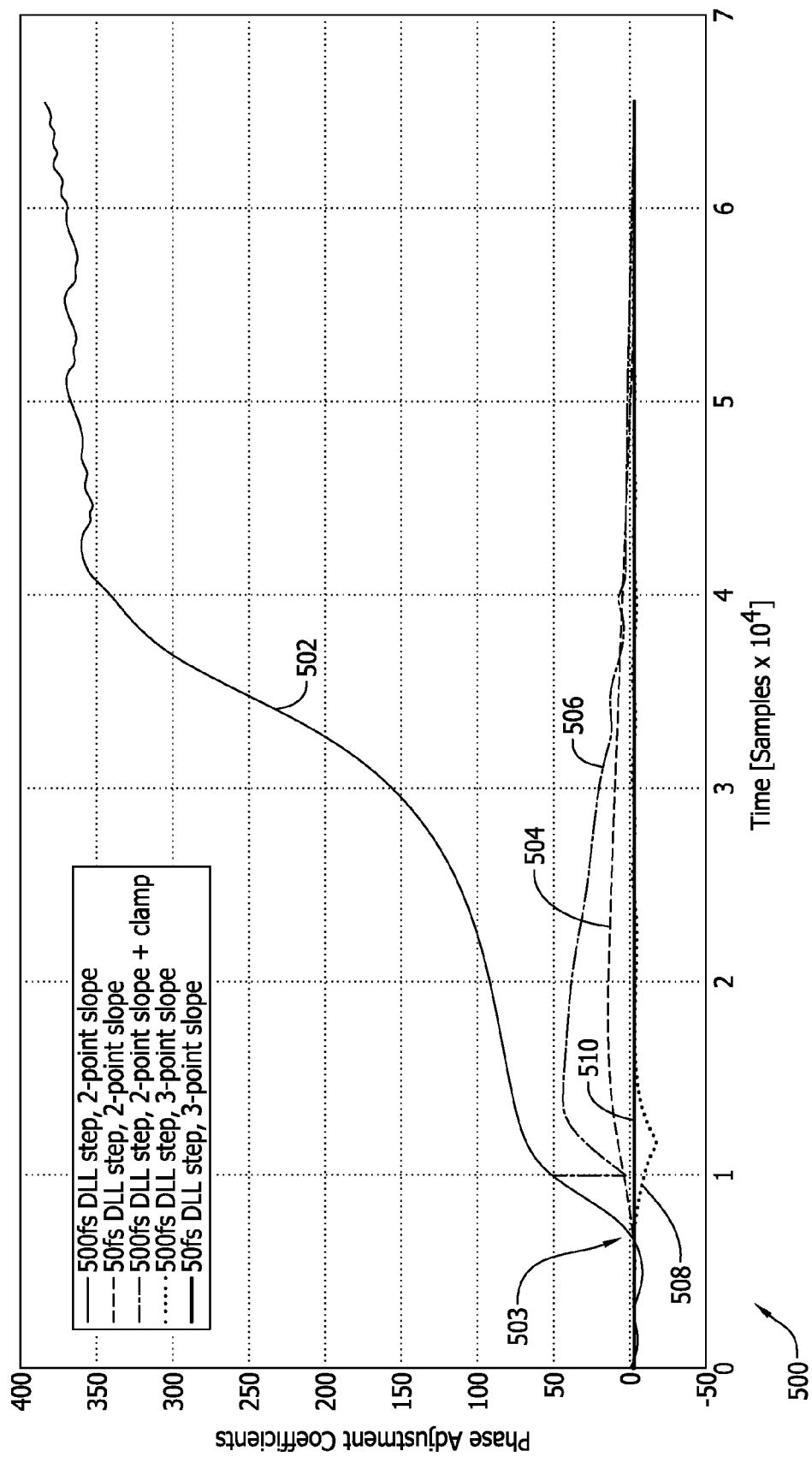

FIG. 5 is an exemplary simulation plot 500 of the phase adjustment coefficient values versus sample time for the two point, two point with clamp, and three point calibration methods shown and described above with reference to FIGS. 1-3. In the exemplary simulation plot 500, a first data set 502 represents phase calibration coefficient versus sample time for a time-interleaved ADC circuit with a 500 femtosecond (fs) delay-locked loop (DLL) step size using the two point calibration method, as shown and described above with reference to FIG. 1. After about time sample 7000, a simulated SEU 503 is introduced into the calibration engine simulation (in the form of a register sign reversal) and the phase adjustment coefficient of first data set 502 rises suddenly from about zero to about 80 at a time sample of approximately 15,000. From time sample 15,000, first data set 502 diverges exponentially, reaching a phase adjustment coefficient of about 360 at about time sample 42,000. From time sample 42,000, phase adjustment coefficient of first data set 502 continues to rise roughly linearly, reaching about 380 at a time sample of approximately 65,000. The phase calibration register will never recover the correct near-zero value thereafter.

A second data set 504 represents phase calibration coefficient versus sample time for a time-interleaved ADC circuit with a 50 fs DLL step size using the two point calibration method, as shown and described above with reference to FIG. 1. After about time sample 7000, a simulated SEU 503 is introduced into the calibration engine simulation and the phase adjustment coefficient of second data set 504 rises in a moderately logarithmic fashion from about zero to about 15 at a time sample of approximately 17,500. From time sample 17,500, second data set 504 decreases gradually roughly linearly, returning to a phase adjustment coefficient of about zero at about time sample 50,000. Improved performance of second data set 504 relative to first data set 502 is observed with an order of magnitude more granular DLL step size, as expected.

A third data set 506 represents phase adjustment coefficient versus sample time for an exemplary time-interleaved ADC circuit with a 500 fs DLL step size using an exemplary two point calibration method with clamp, as shown and described above with reference to FIG. 3, where the clamping level in the threshold register 316 was set to 50. After about time sample 7000, a simulated SEU 503 is introduced into the calibration engine simulation and the phase adjustment coefficient of third data set 506 rises suddenly from about zero to exactly 50 at a time sample of approximately 10,000. At time sample 10,000, third data set 506 is immediately reset to zero and its trajectory undergoes a second ramping which never triggers the reset as it peaks to approximately 45, after which it decreases gradually and roughly linearly, returning to a phase adjustment coefficient of about zero at about time sample 50,000. Markedly improved performance of third data set 506 relative to first data set 502 is observed by implementing two point calibration with clamp. Particularly, such improvement is achieved without significantly more circuit complexity and expense such as, for instance, in the DLL.

A fourth data set 508 represents phase adjustment coefficient versus sample time for an exemplary time-interleaved ADC circuit with a 500 fs DLL step size using an exemplary three point calibration method, as shown and described above with reference to FIG. 2. After about time sample 7000, a simulated SEU 503 from a heavy ion strike is introduced into the calibration engine simulation and the phase adjustment coefficient of fourth data set 508 slightly decreases in a roughly linear manner to about to about −15 at a time sample of approximately 11,500. From time sample 11,500, fourth data set 508 increases back in a roughly linear fashion, and quickly returns to a phase adjustment coefficient of about zero at about time sample 15,000. Markedly improved performance of fourth data set 508 relative to first data set 502, second data set 504, and even third data set 506 is observed by implementing the three point calibration method. Particularly, such improvement is achieved without significantly more complicated circuit complexity or expense, and by adding just one additional register, i.e., third register 216.

A fifth data set 510 represents phase adjustment coefficient versus sample time for an exemplary time-interleaved ADC circuit combining a very fine 50 fs DLL step size with an exemplary three point calibration method, as shown and described above with reference to FIG. 2. After about time sample 7000, a simulated SEU 503 is introduced into the calibration engine simulation and the phase adjustment coefficient of fifth data set 510 decreases only negligibly from about zero to about −5 at a time sample of approximately 15,000. From time sample 15,000, fifth data set 510 quickly returns to a phase adjustment coefficient of about zero at about time sample 23,000. Markedly improved performance of fifth data set 510 relative to first data set 502, second data set 504, and third data set 506 is observed by implementing the three point calibration method combined with an already advantageous, if more complex and expensive, 50 fs DLL step size.

Figure 6:
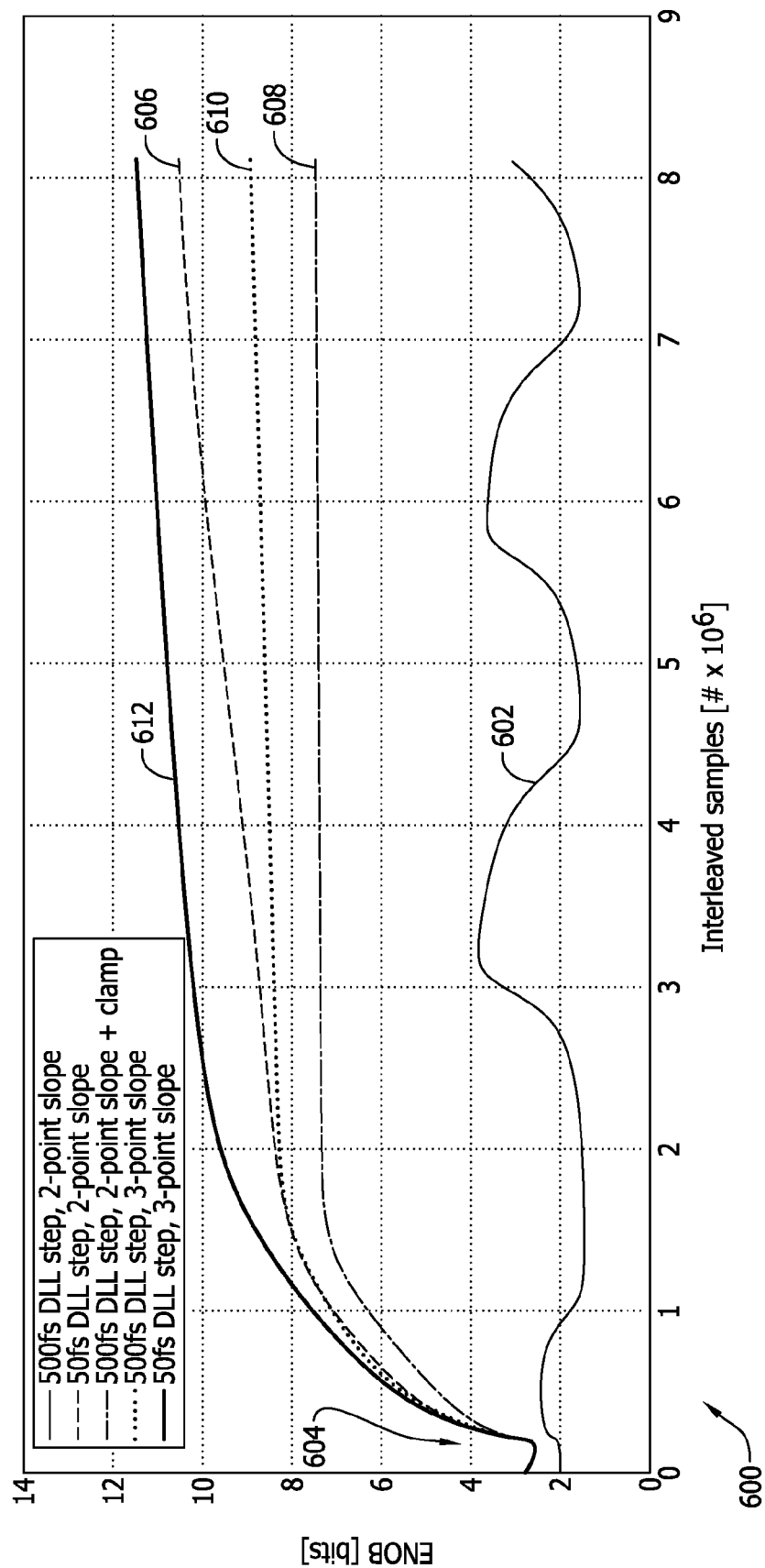

FIG. 6 is an exemplary simulation plot 600 of the ADC resolution as rated via its Effective Number of Bits (ENOB) versus number of interleaved samples for the two point, two point with clamp, and three point calibration methods shown and described above in FIGS. 1-3. In the exemplary simulation plot 600, a sixth data set 602 represents ENOB versus number of interleaved samples for a time-interleaved ADC circuit with a 500 fs DLL step size using the two point calibration method, as shown and described above with reference to FIG. 1. At about sample number 200,000, a simulated SEU 604 is introduced into the calibration engine simulation, after which the ENOB varies periodically for the remainder of the simulation, reaching a minimum of about 1.5 bits and maximum of about 4 bits. The time-interleaved ADC will never recover its 9 or greater ENOB performance until the next hard reset is imparted.

A seventh data set 606 represents ENOB versus number of interleaved samples for a time-interleaved ADC circuit with a 50 fs DLL step size using the two point calibration method, as shown and described above with reference to FIG. 1. After about sample number 200,000, a simulated SEU 604 is introduced into the calibration engine simulation, after which the ENOB increases logarithmically, reaching about 9 bits at about sample number 3,500,000. From sample number 3,500,000, seventh data set 606 continues to slowly settle exponentially through the end of simulation to about 10.5 bits.

An eighth data set 608 represents ENOB versus number of interleaved samples for an exemplary time-interleaved ADC circuit with a 500 fs DLL step size using an exemplary two point calibration method with clamp, as shown and described above with reference to FIG. 3. After about sample number 200,000, a simulated SEU 604 is introduced into the calibration engine simulation, after which the ENOB increases almost logarithmically, reaching about 7 bits at about sample number 1,300,000. From sample number 1,300,000, eighth data set 608 linearly rises to 7.5 bits through the end of simulation. Improved performance, especially in terms of non-divergent behavior of the post-SEU ENOB, of eighth data set 608 relative to sixth data set 602 is observed with the same coarse-step DLL by implementing two point calibration with clamp. Particularly, such improvement is achieved without significantly more complicated circuit complexity or expense.

A ninth data set 610 represents ENOB versus number of interleaved samples for an exemplary time-interleaved ADC circuit with a 500 fs DLL step size using an exemplary three point calibration method, as shown and described above with reference to FIG. 2. After about sample number 200,000, a simulated SEU 604 is introduced into the calibration engine simulation, after which the ENOB increases logarithmically, reaching about 8.3 bits at about sample number 2,000,000. From sample number 2,000,000, ninth data set 610 slowly rises linearly to about 9 bits through the end of simulation. Markedly improved performance, especially in terms of non-divergent behavior and final ENOB level post-SEU, of ninth data set 610 relative to sixth data set 602 is observed by implementing three point calibration. Particularly, such improvement is achieved without significantly more complicated circuit complexity or expense by adding just one additional register, i.e., third register 216, as shown and described above with reference to FIG. 2.

A tenth data set 612 represents ENOB versus number of interleaved samples for an exemplary time-interleaved ADC circuit combining a very fine 50 fs DLL step size with an exemplary three point calibration method, as shown and described above with reference to FIG. 2. After about sample number 200,000, a simulated SEU 604 is introduced into the calibration engine simulation, after which the ENOB increases logarithmically, settling at about 11.3 bits at about sample number 8,000,000. Markedly improved performance, especially in terms of ADC resolution performance, of tenth data set 612 relative to sixth data set 602 and seventh data set 606, is observed by implementing the three point calibration method combined with an already advantageous, if more complicated and expensive, 50 fs DLL step size. Particularly, while achieved upon a more granular DLL step size, such achievement is achieved by adding just one additional register, i.e., third register 216 (not shown). Thus, both coarse DLL and very fine DLL step size time-interleaved ADC circuits benefit from either two point calibration with clamp or three point calibration in terms of performance, speed of recovery from SEUs, and final functionality system-wise (i.e., no divergence).

Example systems and apparatus of the radiation-hardened interleaved ADC circuits and methods of calibrating the same are described above in detail. The apparatus illustrated is not limited to the specific implementations described herein, but rather, components of each may be utilized independently and separately from other components described herein. Each system component can also be used in combination with other system components.

Some implementations involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer-readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms memory, processor, and processing device.

The above-described implementations of the radiation-hardened interleaved ADC circuits and methods of calibrating the same effectively improve the precision of approximated time derivatives for LMS-based calibration. Also, the above-described radiation-hardened interleaved ADC circuits and methods of calibrating the same mitigate or prevent negative effects due to incorrect evolution direction and error propagation, thus yielding superior efficiency calibrations and preventing system failures, including, without limitation, under SEE operating conditions. Further, the above-described implementations of the radiation-hardened interleaved ADC circuits and methods of calibrating the same improve speed, resolution, and reliability of time-interleaved ADCs without greatly increased circuit complexity and expense. Furthermore, the above described implementations of the radiation-hardened interleaved ADC circuits and methods of calibrating the same are very cost-effective solutions and are readily adaptable to both coarse DLLs or very fine DLLs with either "round robin" or "auxiliary slice" operating schemes. Moreover, the above-described implementations of the radiation-hardened interleaved ADC circuits and methods of calibrating the same are implementable in modern applications demanding sampling frequencies into gigahertz (GHz) ranges, 10 bit or greater resolution, and calibration step sizes down to 50 femtoseconds (fs) and below to yield higher resolution and lower distortion performance, and faster recovery time from SEEs or other disruptions such as power supply brownout.

Exemplary technical effects of the above-described implementations of the radiation-hardened interleaved ADC circuits and methods of calibrating the same includes at least one or more of the following: (a) improving the precision of approximated time derivatives for LMS-based calibration; (b) mitigating or preventing negative effects due to incorrect evolution direction and error propagation; (c) improving efficiency of calibrations and preventing system failures, including, without limitation, under SEE operating conditions; (d) improving speed, resolution, and reliability of time-interleaved ADCs without greatly increasing circuit complexity and expense; (e) providing very cost-effective solutions for time-interleaved ADC calibration that are readily adaptable to both coarse DLLs or very fine DLLs with either "round robin" or "auxiliary slice" operating schemes; and (f) providing time-interleaved ADC circuits and calibration methods that are implementable in modern applications demanding sampling frequencies into GHz ranges, 10 bit or greater resolution, and calibration step sizes down to 50 fs and below to yield higher resolution and lower distortion performance, and faster recovery from SEEs or other disruptions such as power supply brownout.

Although specific features of various implementations of the disclosure may be shown in some drawings and not in others, this is for convenience only. In accordance with the principles of the disclosure, any feature of a drawing may be referenced and/or claimed in combination with any feature of any other drawing.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An analog-to-digital converter (ADC) circuit comprising:
   at least a first, a second, and a third ADC slice configured to sample an analog input signal and transmit a digitally converted signal thereof representative of a first, a second, and a third value of the analog input signal at a first, a second, and a third consecutively sampled time point thereof, respectively;
   at least one reference ADC slice configured to sample the analog input signal and transmit a digitally converted reference value to facilitate determining an error value;
   a first, a second, and a third register coupled to said first, second, and third ADC slices, and configured to store the first, second, and third values, respectively;
   a reference register coupled to said at least one reference ADC slice, and configured to store the reference value;
   a delay register comprising an input and an output, and configured to produce a sample time adjustment signal, wherein the sample time adjustment signal facilitates adjustment of a phase of a next time sampling of the analog input signal by said second ADC slice; and
   a plurality of computational circuit elements coupled to said input, said output, said first, second, and third registers, and said reference register, and configured to determine the error value, a value of an approximate time derivative of the analog input signal estimated from the third, the second, and the first sampled time point, and a value of the sample time adjustment signal.

2. An ADC circuit in accordance with claim 1, wherein:
   said plurality of computational circuit elements comprises a first summer, a second summer, a third summer, and a multiplier, wherein:
     said first summer coupled to and between said first register and said third register, said first summer further coupled to said multiplier;
     said second summer coupled to and between said second register and said reference register, said second summer further coupled to said multiplier;
     said multiplier coupled to and between said first summer and said second summer, said multiplier further coupled to said third summer; and
     said third summer coupled to and between said multiplier and said input.

3. An ADC circuit in accordance with claim 2, wherein:
said first summer configured to determine a first difference between the third value and the first value, a value of the first difference representative of the approximate time derivative, said first summer further configured to transmit a value of the approximate time derivative to said multiplier;
said second summer configured to determine a second difference between the reference value and the second value, a value of the second difference representative of the error value, said second summer further configured to transmit the error value to said multiplier;
said multiplier configured to determine a product of the first difference and the second difference, said multiplier further configured to transmit a value of the product to said third summer; and
said third summer configured to determine a sum of the product and the value of the sample time adjustment signal, said third summer further configured to transmit a value of the sum to said input.

4. An ADC circuit in accordance with claim 3, wherein:
said third summer further configured to determine a sum of:
a value of a phase adjustment coefficient of calibration of a current time sampling; and
a product of a value of a gain, the value of the approximate time derivative, and the error value, the sum representative of the value of the sample time adjustment signal; and
said delay register further configured to:
store the value of the gain; and
transmit the sample time adjustment signal to said second ADC slice to facilitate mitigation of a sampling phase mismatch error.

5. A method of calibrating an analog-to-digital converter (ADC) comprising:
consecutively sampling an analog input signal via at least a first, a second, and a third ADC slice;
sampling, via at least one reference ADC slice, the analog input signal;
transmitting, via the first, second, and third ADC slices, a first, a second, and a third digitally converted signal representative of a first, a second, and a third value of the analog input signal at a first, a second, and a third consecutively sampled time point thereof, respectively;
transmitting, via the at least one reference ADC slice, a digitally converted reference value to facilitate determining an error value;
storing, via a first, a second, and a third register coupled to the first, second, and third ADC slices, respectively, the first, second, and third values, respectively;
storing, via a reference register coupled to the at least one reference ADC slice, the reference value;
determining, via a plurality of computational circuit elements, the error value, a value of an approximate time derivative of the analog input signal estimated from the third, the second and the first sampled time point, and a value of a sample time adjustment signal;
transmitting, via the plurality of computational circuit elements, the sample time adjustment signal;
storing, via a delay register coupled to the plurality of computational circuit elements, the value of the sample time adjustment signal;
delaying by at least one cycle, via the delay register, a determination of a value of a change in a timing of the digitally converted signal;
producing and transmitting, via the delay register, the sample time adjustment signal to facilitate adjustment of a phase of a next time sampling of the analog input signal by the second ADC slice; and
adjusting the phase of the next time sampling of the analog input signal by the second ADC slice.

6. A method in accordance with claim 5, wherein the plurality of computational circuit elements include a first, a second, and a third summer, and a multiplier, wherein determining comprises:
determining, via the first summer, a value of a first difference between the third value and the first value, the value of the first difference representative of the approximate time derivative of the analog input signal;
determining, via the second summer, a value of a second difference between the reference value and the second value, the value of the second difference representative of the error value;
determining, via the multiplier, a value of a product of the first difference and the second difference, the value of the product representative of the value of the sample time adjustment signal; and
determining, via the third summer, a value of a sum of the product and the value of the sample time adjustment signal.

7. A method in accordance with claim 6, wherein transmitting, via the plurality of computational circuit elements, the sample time adjustment signal comprises:
transmitting the value of the first difference and the value of the second difference to the multiplier;
transmitting the value of the product to the third summer; and
transmitting the value of the sum to the delay register.

8. A method in accordance with claim 7, wherein producing and transmitting, via the delay register, the sample time adjustment signal to facilitate adjustment of the phase of the next time sampling of the analog input signal by the second ADC slice comprises transmitting the sample time adjustment signal to both of the second ADC slice and the third summer.

9. An analog-to-digital converter (ADC) circuit comprising:
at least a first and a second ADC slice configured to sample an analog input signal and transmit a digitally converted signal thereof representative of a first and a second value of the analog input signal at a first and a second consecutively sampled time point thereof, respectively;
at least one reference ADC slice configured to sample the analog input signal and transmit a digitally converted reference value to facilitate determining an error value;
a first and a second register coupled to said first and second ADC slices, and configured to store the first and second values, respectively;
a reference register coupled to said at least one reference ADC slice, and configured to store the reference value;
a delay reset register comprising an input, a reset input, and an output, and configured to produce a sample time adjustment signal and store and accumulate a value thereof, wherein the sample time adjustment signal facilitates adjustment of a phase of a next time sampling of the analog input signal by said second ADC slice;
a comparator comprising a comparator output coupled to said reset input, a first input coupled to said output, and a second input;

a threshold register coupled to said second input, and configured to store a predetermined clamp value, said comparator configured to compare an accumulated value of the sample time adjustment signal to the clamp value and transmit a reset signal from said comparator output to said reset input to facilitate resetting the accumulated value when at least one of the following outcomes of a comparator comparison occurs:
the value of the sample time adjustment signal equals the clamp value; and
the value of the sample time adjustment signal is greater than the clamp value; and
a plurality of computational circuit elements coupled to said input, said output, said first and second registers, and said reference register, and configured to determine the error value, a value of an approximate time derivative of the analog input signal estimated from the second and the first sampled time point, and the value of the sample time adjustment signal.

10. An ADC circuit in accordance with claim 9, wherein:
said plurality of computational circuit elements comprises a first summer, a second summer, a third summer, and a multiplier, wherein:
said first summer coupled to and between said first register and said second register, said first summer further coupled to said multiplier;
said second summer coupled to and between said second register and said reference register, said second summer further coupled to said multiplier;
said multiplier coupled to and between said first summer and said second summer, said multiplier further coupled to said third summer; and
said third summer coupled to and between said multiplier and said input.

11. An ADC circuit in accordance with claim 10, wherein:
said first summer configured to determine a first difference between the second value and the first value, a value of the first difference representative of the approximate time derivative of the analog input signal, said first summer further configured to transmit a value of the approximate time derivative to said multiplier;
said second summer configured to determine a second difference between the reference value and the first value, a value of the second difference representative of the error value, said second summer further configured to transmit the error value to said multiplier;
said multiplier configured to determine a product of the first difference and the second difference, said multiplier further configured to transmit a value of the product to said third summer; and
said third summer configured to determine a sum of the product and the value of the sample time adjustment signal, said third summer further configured to transmit a value of the sum to said input.

12. An ADC circuit in accordance with claim 11, wherein:
said third summer further configured to determine a sum of:
a value of a phase adjustment coefficient of calibration of a current time sampling; and
a product of a value of a gain, the value of the approximate time derivative of the analog input signal, and the error value, the sum representative of the value of the sample time adjustment signal; and said delay reset register further configured to:
store the value of the gain; and
transmit the sample time adjustment signal to said second ADC slice to facilitate mitigation of a sampling phase mismatch error.

13. A method of calibrating an analog-to-digital converter (ADC) comprising:
consecutively sampling an analog input signal via at least a first and a second ADC slice;
sampling, via at least one reference ADC slice, the analog input signal;
transmitting, via the first and second ADC slices, digitally converted signals representative of a first and a second value of the analog input signal at a first and a second consecutively sampled time point thereof, respectively;
transmitting, via the at least one reference ADC slice, a digitally converted reference value to facilitate determining an error value;
storing, via a first and a second register coupled to the first and second ADC slices, respectively, the first and second values, respectively;
storing, via a reference register coupled to the at least one reference ADC slice, the reference value;
determining, via a plurality of computational circuit elements, the error value, a value of an approximate time derivative of the analog input signal estimated from the second and the first sampled time point, and a value of a sample time adjustment signal;
transmitting, via the plurality of computational circuit elements, the sample time adjustment signal;
storing, via a delay reset register coupled to the plurality of computational circuit elements, the value of the sample time adjustment signal;
delaying by at least one cycle, via the delay reset register, determination of a value of a change in a timing of the digitally converted signal;
storing, via a threshold register, a predetermined clamp value;
accumulating and storing, via the delay reset register, an accumulated value of the sample time adjustment signal;
comparing, via a comparator, the clamp value and the value of the sample time adjustment signal;
producing and transmitting, via the delay reset register, the sample time adjustment signal to facilitate adjustment of a phase of a next time sampling of the analog input signal by the second ADC slice;
adjusting the phase of the next time sampling of the analog input signal by the second ADC slice; and
resetting, via the delay reset register, the accumulated value when at least one of the following outcomes of said comparing occurs:
the value of the sample time adjustment signal equals the clamp value; and
the value of the sample time adjustment signal is greater than the clamp value.

14. A method in accordance with claim 13, wherein the plurality of computational circuit elements include a first, a second, and a third summer, and a multiplier, wherein determining comprises:
determining, via the first summer, a value of a first difference between the second value and the first value, the value of the first difference representative of the approximate time derivative of the analog input signal;

determining, via the second summer, a value of a second difference between the reference value and the second value, the value of the second difference representative of the error value;

determining, via the multiplier, a value of a product of the first difference and the second difference, the value of the product representative of the value of the sample time adjustment signal; and determining, via the third summer, a value of a first sum of the product and the value of the sample time adjustment signal.

15. A method in accordance with claim 14, wherein transmitting, via the plurality of computational circuit elements, the sample time adjustment signal comprises:

transmitting the value of the first difference and the value of the second difference to the multiplier;

transmitting the value of the product to the third summer; and transmitting the value of the first sum to the delay reset register.

16. A method in accordance with claim 15 wherein accumulating and storing, via the delay reset register, an accumulated value of the sample time adjustment signal comprises:

determining, via the delay reset register, a value of a second sum of a previous sample time value of the sample time adjustment signal stored in the delay reset register and a value of a current time product, the value of the second sum representative of the accumulated value; and storing, via the delay reset register, the value of the second sum.

17. A method in accordance with claim 16, wherein producing and transmitting, via the delay reset register, the sample time adjustment signal to facilitate adjustment of the phase of the next time sampling of the analog input signal by the second ADC slice comprises transmitting the sample time adjustment signal to both of the second ADC slice and the third summer.

18. An analog-to-digital converter (ADC) circuit comprising:

at least a first, a second, and a third ADC slice configured to sample an analog input signal and transmit a digitally converted signal thereof representative of a first, a second, and a third value of the analog input signal at a first, a second, and a third consecutively sampled time point thereof, respectively;

at least one reference ADC slice configured to sample the analog input signal and transmit a digitally converted reference value to facilitate determining an error value;

a first, a second, and a third register coupled to said first, second, and third ADC slices, and configured to store the first, second, and third values, respectively;

a reference register coupled to said at least one reference ADC slice, and configured to store the reference value;

a delay reset register comprising an input, a reset input, and an output, and configured to produce a sample time adjustment signal and store and accumulate a value thereof, wherein the sample time adjustment signal facilitates adjustment of a phase of a next time sampling of the analog input signal by said second ADC slice;

a comparator comprising a comparator output coupled to said reset input, a first input coupled to said output, and a second input;

a threshold register coupled to said second input, and configured to store a predetermined clamp value, said comparator configured to compare an accumulated value of the sample time adjustment signal to the clamp value and transmit a reset signal from said comparator output to said reset input to facilitate resetting the accumulated value when at least one of the following outcomes of a comparator comparison occurs:

the value of the sample time adjustment signal equals the clamp value; and the value of the sample time adjustment signal is greater than the clamp value; and a plurality of computational circuit elements coupled to said input, said output, said first, second, and third registers, and said reference register, and configured to determine the error value, a value of an approximate time derivative of the analog input signal estimated from the third, the second and the first sampled time point, and the value of the sample time adjustment signal.

19. An ADC circuit in accordance with claim 18, wherein:

said plurality of computational circuit elements comprises a first summer, a second summer, a third summer, and a multiplier, wherein:

said first summer coupled to and between said first register and said third register, said first summer further coupled to said multiplier;

said second summer coupled to and between said second register and said reference register, said second summer further coupled to said multiplier;

said multiplier coupled to and between said first summer and said second summer, said multiplier further coupled to said third summer; and said third summer coupled to and between said multiplier and said input.

20. An ADC circuit in accordance with claim 19, wherein:

said first summer configured to determine a first difference between the third value and the first value, a value of the first difference representative of the approximate time derivative of the analog input signal, said first summer further configured to transmit a value of the approximate time derivative to said multiplier;

said second summer configured to determine a second difference between the reference value and the second value, a value of the second difference representative of the error value, said second summer further configured to transmit the error value to said multiplier;

said multiplier configured to determine a product of the first difference and the second difference, said multiplier further configured to transmit a value of the product to said third summer; and said third summer configured to determine a sum of the product and the value of the sample time adjustment signal, said third summer further configured to transmit a value of the sum to said input.

21. An ADC circuit in accordance with claim 20, wherein:

said third summer further configured to determine a sum of:

a value of a phase adjustment coefficient of calibration of a current time sampling; and a product of a value of a gain, a value of the approximate time derivative of the analog input signal, and the error value, the sum representative of the value of the sample time adjustment signal; and said delay reset register further configured to:

to store the value of the gain; and transmit the sample time adjustment signal to said second ADC slice to facilitate mitigation of a sampling phase mismatch error.

22. A method of calibrating an analog-to-digital converter (ADC) comprising:
consecutively sampling an analog input signal via at least a first, a second, and a third ADC slice;
sampling, via at least one reference ADC slice, the analog input signal;
transmitting, via the first, second, and third ADC slices, digitally converted signals representative of a first, a second, and a third value of the analog input signal at a first, a second, and a third consecutively sampled time point thereof, respectively;
transmitting, via the at least one reference ADC slice, a digitally converted reference value to facilitate determining an error value;
storing, via a first, a second, and a third register coupled to the first, second, and third ADC slices, respectively, the first, second, and third values, respectively;
storing, via a reference register coupled to the at least one reference ADC slice, the reference value;
determining, via a plurality of computational circuit elements, the error value, a value of an approximate time derivative of the analog input signal estimated from the third, the second and the first sampled time point, and a value of a sample time adjustment signal;
transmitting, via the plurality of computational circuit elements, the sample time adjustment signal;
storing, via a delay reset register coupled to the plurality of computational circuit elements, the value of the sample time adjustment signal;
delaying by at least one cycle, via the delay reset register, determination of a value of a change in a timing of the digitally converted signal;
storing, via a threshold register, a predetermined clamp value;
accumulating and storing, via the delay reset register, an accumulated value of the sample time adjustment signal;
comparing, via a comparator, the clamp value and the value of the sample time adjustment signal;
producing and transmitting, via the delay reset register, the sample time adjustment signal to facilitate adjustment of a phase of a next time sampling of the analog input signal by the second ADC slice;
adjusting the phase of the next time sampling of the analog input signal by the second ADC slice; and
resetting, via the delay reset register, the accumulated value when at least one of the following outcomes of said comparing occurs:
the value of the sample time adjustment signal equals the clamp value; and
the value of the sample time adjustment signal is greater than the clamp value.

23. A method in accordance with claim 22, wherein the plurality of computational circuit elements includes a first, a second, and a third summer, and a multiplier, wherein determining comprises:
determining, via the first summer, a value of a first difference between the third value and the first value, the value of the first difference representative of the approximate time derivative of the analog input signal;
determining, via the second summer, a value of a second difference between the reference value and the second value, the value of the second difference representative of the error value;
determining, via the multiplier, a value of a product of the first difference and the second difference, the value of the product representative of the value of the sample time adjustment signal; and
determining, via the third summer, a value of a first sum of the product and the value of the sample time adjustment signal.

24. A method in accordance with claim 23, wherein transmitting, via the plurality of computational circuit elements, the sample time adjustment signal comprises:
transmitting the value of the first difference and the value of the second difference to the multiplier;
transmitting the value of the product to the third summer; and
transmitting the value of the first sum to the delay reset register.

25. A method in accordance with claim 24, wherein accumulating and storing, via the delay reset register, an accumulated value of the sample time adjustment signal comprises:
determining, via the delay reset register, a value of a second sum of a previous sample time value of the sample time adjustment signal stored in the delay reset register and a value of a current time product, the value of the second sum representative of the accumulated value; and
storing, via the delay reset register, the value of the second sum.

26. A method in accordance with claim 25, wherein producing and transmitting, via the delay reset register, the sample time adjustment signal to facilitate adjustment of the phase of the next time sampling of the analog input signal by the second ADC slice comprises transmitting the sample time adjustment signal to both of the second ADC slice and the third summer.

* * * * *